United States Patent

Gehring et al.

[15] 3,684,972

[45] Aug. 15, 1972

[54] INTEGRATED OPERATIONAL AMPLIFIER

[72] Inventors: Gerhard Gehring, Grafelfingerstr. 21, 8 Munich 55; Wilfried Hammelehle, Giesinger Bahnhofplatz 5, 8 Munich 90, both of Germany

[22] Filed: Aug. 18, 1970

[21] Appl. No.: 64,708

[30] Foreign Application Priority Data

Aug. 29, 1969 Germany..........P 19 44 075.6

[52] U.S. Cl...............330/30 R, 330/38 M, 330/30 D

[51] Int. Cl................................................H03f 3/68

[58] Field of Search..............330/30, 30 D, 38 M, 69

[56] References Cited

UNITED STATES PATENTS 3,416,092 12/1968 Frederiksen.............330/69 X

*Primary Examiner*—Roy Lake
*Assistant Examiner*—Lawrence J. Dahl
*Attorney*—Curt M. Avery, Arthur E. Wilfond, Herbert L. Lerner and Daniel J. Tick

[57] ABSTRACT

In an integrated operational amplifier, a reference transistor has a base electrode directly connected to the base electrode of a feedback transistor, a collector electrode directly connected to its own base electrode and an emitter electrode directly connected to a source of reference voltage. The collector-emitter path of the feedback transistor is connected in series with an ohmic resistor to the emitter electrodes of both transistors of a difference amplifier.

4 Claims, 1 Drawing Figure

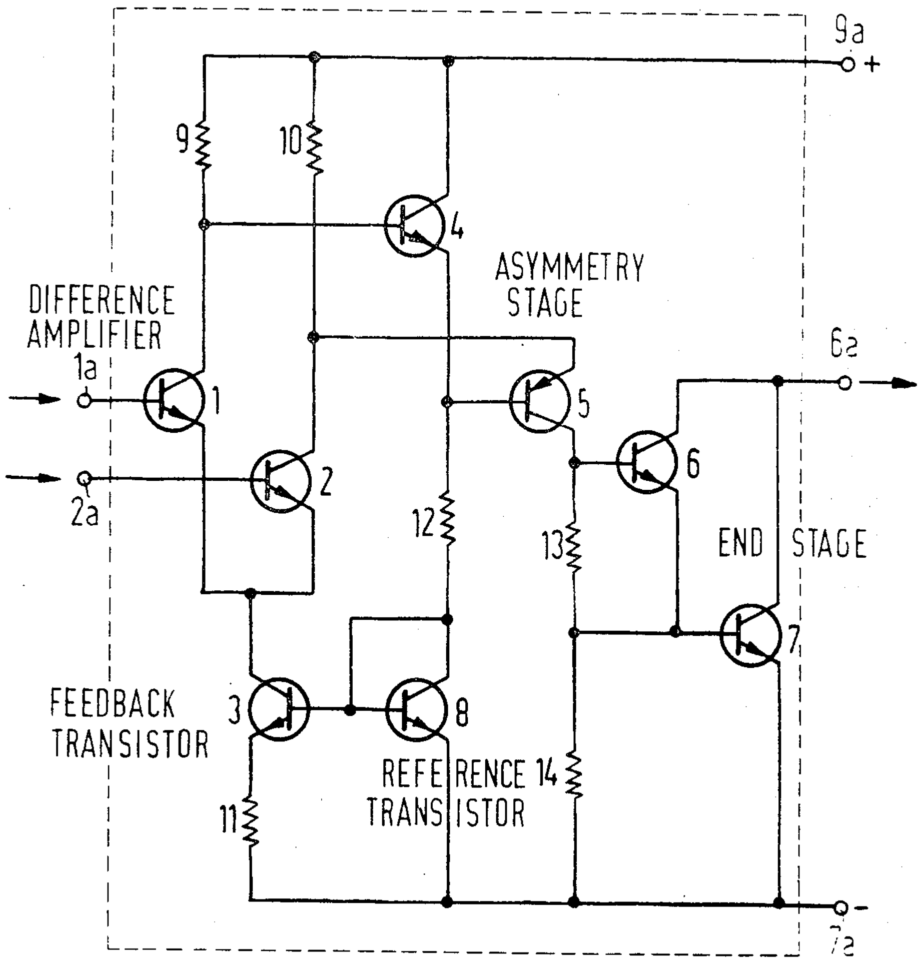
9a
+
9
10
4
ASYMMETRY
STAGE
DIFFERENCE
AMPLIFIER
1a
1
5
6a
2
6
2a
12
13
END STAGE
7
3
8
FEEDBACK
TRANSISTOR
REFERENCE
TRANSISTOR
14
11
-
7a

INTEGRATED OPERATIONAL AMPLIFIER

DESCRIPTION OF THE INVENTION

The invention relates to an integrated operational amplifier. More particularly, the invention relates to an integrated operational amplifier of the type of a DC voltage amplifier having a difference amplifier input and an asymmetrical output.

An amplifier of the type of the invention is controlled by the difference between two voltages. When the difference between the two voltages is zero, the output voltage of the operational amplifier should be zero. The absolute value of the input voltage relative to a fixed reference potential, relative to ground, for example, should remain within a wide range, which is the inphase range or synchronism, without action, or inphase rejection. Thus, a plurality of operational amplifiers may be directly connected in series, without any special measures. To obtain the best possible accuracy for computer operations utilizing operational amplifiers, some basic requirements are the highest possible amplification, high input resistance, low output resistance, and a wide range of modulation or control. Furthermore, specific value should be placed upon the constancy of the values which determine the computer operations, and high accuracy requirements are necessary, particularly with regard to temperature. The temperature dependency may be kept small by arranging the components according to the pairing principle and may be provided with relatively small effort, by compensating individual temperature dependencies.

An operational amplifier which may be purchased, and which meets the aforedescribed requirements, thus comprises a difference amplifier at the input of the operational amplifier, an asymmetry stage for making the signal derived from the difference amplifier asymmetrical, by providing a shift in potential, for example, and a single phase end stage provided in Darlington connection at the output of the operational amplifier. The dynamic feedback resistance of the difference amplifier is provided by a transistor having an emitter resistance controlled by the reference voltage. The feedback transistor provides current to both branches of the difference amplifier. The reference voltage is provided by a diode having an ohmic resistor connected in series. The Darlington end stage also requires a current source of impressed current, provided via a transistor.

The operational amplifier of the aforedescribed type meets the requirements to a large extent. However, the required effort or expense is still relatively high. In view of the importance of providing an extremely economical operational amplifier for use in the electrotechnical industry, an operational amplifier should not only better meet the requirements, but should also require less effort and expense.

The principal object of the invention is to provide a new and improved integrated operational amplifier.

An object of the invention is to provide an integrated operational amplifier which fully meets the requirements therefor.

An object of the invention is to provide an integrated operational amplifier which requires relatively little effort and expense for its production and operation.

An object of the invention is to provide an integrated operational amplifier which functions with efficiency, effectiveness and reliability.

In accordance with the invention, an integrated operational amplifier comprises a source of supply voltage, a source of reference voltage and first and second ohmic resistors. A difference amplifier comprises first and second transistors each having a base electrode, a collector electrode connected to the source of supply voltage via a corresponding one of the first and second ohmic resistors, and an emitter electrode connected in common with that of the other. Input means connected to the base electrodes of the first and second transistors of the difference amplifier supplies inverted and non-inverted signals. A common emitter resistance is connected between the emitter electrodes of the first and second transistors of the difference amplifier and the source of reference voltage. The common emitter resistance comprises a third ohmic resistor connected in series with the collector-emitter path of a feedback transistor. The feedback transistor has a base electrode. An asymmetry stage comprises fourth and fifth transistors of different conductivity types. The fifth transistor has an emitter electrode directly connected to the collector electrode of the second transistor of the difference amplifier, a collector electrode and a base electrode directly connected to the emitter electrode of the fourth transistor of the asymmetry stage. The fourth transistor has an emitter electrode directly connected to the base electrode of the fifth transistor of the asymmetry stage, a base electrode directly connected to the collector electrode of the first transistor of the difference amplifier and a collector electrode directly connected to the source of supply voltage. A fourth ohmic resistor is connected at one end to the emitter electrode of the fourth transistor and the base electrode of the fifth transistor of the asymmetry stage and at the other end to the base electrode of the feedback transistor. An end stage comprises sixth and seventh transistors. The sixth transistor has a base electrode directly connected to the collector electrode of the fifth transistor of the asymmetry stage, an emitter electrode directly connected to the base electrode of the seventh transistor of the end stage and a collector electrode. The seventh transistor has a base electrode connected to the emitter electrode of the sixth transistor, a collector electrode directly connected to the collector electrode of the sixth transistor and an emitter electrode directly connected to the source of reference voltage. A fifth ohmic resistor is connected at one end to the collector electrode of the fifth transistor of the asymmetry stage and the base electrode of the sixth transistor of the end stage and is connected at the other end to the emitter electrode of the sixth transistor and the base electrode of the seventh transistor of the end stage. A sixth ohmic resistor is connected between the base electrode of the seventh transistor of the end stage and the source of reference voltage. Output means is connected to the collector electrodes of the sixth and seventh transistors of the end stage for providing the output of the operational amplifier. A reference transistor has a base electrode directly connected to the base electrode of the feedback transistor, a collector electrode directly connected to the base electrode thereof and an emitter electrode directly connected to the source of reference voltage.

Each transistor is of the same conductivity type and the fifth transistor of the asymmetry stage is of the opposite conductivity type. Each transistor is of npn conductivity type and the fifth transistor of the asymmetry stage is of pnp conductivity type. The feedback transistor has a collector electrode directly connected to the emitter electrode of each of the first and second transistors of the difference amplifier and an emitter electrode connected to the third ohmic resistor. The third ohmic resistor is directly connected to the source of reference potential.

It is thus seen, as hereinbefore described, that the solution provided by the present invention is that the base electrode of the feedback or current-impressing transistor is connected to the base electrode and the collector electrode of the reference voltage transistor of npn type. The emitter electrode of the reference transistor is connected to a source of reference potential. The common collector connection of the two transistors of the end stage provides the output of the operational amplifier. The emitter electrode of one of the end stage transistors is directly connected to the source of reference potential.

The integrated operational amplifier of the invention satisfies the aforedescribed requirements to a considerable extent and with a minimum effort and expense. Only six ohmic resistors and eight transistors are utilized in the operational amplifier. Seven of the transistors are of npn type and one of the transistors is of pnp type and delivers only low current amplification.

In order that the invention may be readily carried into effect, it will now be described with reference to the accompanying drawing, wherein the single FIGURE is a circuit diagram of an embodiment of the integrated operational amplifier of the invention.

In the FIGURE, a difference amplifier is connected at the input of the operational amplifier. The difference amplifier comprises first and second transistors 1 and 2, respectively, of npn conductivity type. An input terminal 1*a* is connected to the base electrode of the first transistor 1 and an input terminal 2*a* is connected to the base electrode of the second transistor 2. The input signals applied via the input terminals 1*a*and 2*a* are inverted and non-inverted signals. The collector electrode of the first transistor 1 is connected to a source of supply voltage 9*a*, indicated by a positive polarity symbol, via a first ohmic resistor 9. The collector electrode of the second transistor 2 is connected to the source of supply voltage via a second ohmic resistor 10.

A common dynamic emitter resistance is provided in common for both the first and second transistors 1 and 2 of the difference amplifier. The common emitter resistance comprises a third ohmic resistor 11 connected in series with the collector-emitter path of a current-impressing of feedback transistor 3 of npn type. The collector electrode of the feedback transistor 3 is connected in common to the emitter electrode of each of the first and second transistors 1 and 2. One end of the third ohmic resistor 11 is connected to the emitter electrode of the feedback transistor 3 and the other end of said ohmic resistor is connected to a source of reference voltage 7*a*, indicated by a negative polarity symbol.

An asymmetry stage comprises fourth and fifth transistors 4 and 5, respectively. The fourth transistor is of npn conductivity type and the fifth transistor is of pnp conductivity type. The asymmetry stage functions to produce asymmetry in the signals provided by the difference amplifier. The emitter electrode of the fifth transistor 5 is directly connected to the collector electrode of the second transistor 2 of the difference amplifier. The base electrode of the fifth transistor 5 is directly connected to the emitter electrode of the fourth transistor 4 and is connected to the base electrode of the feedback or current-impressing transistor 3 via a fourth ohmic resistor 12.

The base electrode of the fourth transistor 4 is directly connected to the collector electrode of the first transistor 1 of the difference amplifier. The collector electrode of the fourth transistor 4 is directly connected to the source of supply voltage 9*a*.

In accordance with the invention, a reference or reference voltage transistor 8 is provided. The base electrode and the collector electrode of the reference transistor 8 are connected to each other and are directly connected to the base electrode of the feedback transistor 3. The emitter electrode of the reference transistor is directly connected to the source of reference voltage 7*a* and has the reference voltage. The collector electrode of the reference transistor 8 is connected to one end of the fourth ohmic resistor 12.

A Darlington end stage comprises sixth and seventh transistors 6 and 7, respectively, of npn type. The base electrode of the sixth transistor 6 is directly connected to the collector electrode of the fifth transistor 5 of the asymmetry stage and is connected to the base electrode of the seventh transistor 7 via a fifth ohmic resistor 13. The emitter electrode of the sixth transistor 6 is directly connected to the base electrode of the seventh transistor 7 and to one end of the fifth ohmic resistor 13 and one end of a sixth ohmic resistor 14. The base electrode of the seventh transistor 7 is connected to the source of reference voltage 7*a* via the sixth ohmic resistor 14.

The emitter electrode of the seventh transistor 7 is directly connected to the source of reference voltage 7*a*. The collector electrode of the seventh transistor 7 is directly connected to the collector electrode of the sixth transistor 6. The common collector connection of the sixth and seventh transistors 6 and 7 is connected to an output terminal 6*a*. The output of the operational amplifier is derived from the output terminal 6*a*.

The input signals are supplied to the input terminals 1*a* and 2*a* inverted, and then non-inverted. The signals supplied to the difference amplifier thus include an inphase portion and a push-pull portion. The in-phase portion is suppressed in the difference amplifier. The push-pull portion is derived, amplified, from the first and second transistors 1 and 2 of the difference amplifier as a signal for controlling the asymmetry stage. Such signal is a true symmetrical push-pull signal.

In order to amplify the signal in the end stage, which is a single phase stage, the symmetrical push-pull signal must again be made asymmetrical. This is effected by the asymmetry stage by a shift in potential. The fourth transistor 4 of the asymmetry stage applies the signal voltage derived at the collector resistor 9 to the base electrode of the fifth transistor 5 of said asymmetry stage. The collector ohmic resistor 9 has a low resistance value and has no dynamic load, since such resistor is connected to follow the emitter electrode. Since the emitter electrode of the fifth transistor 5 is directly connected to the collector electrode of the second transistor 2 of the difference amplifier, said fifth transistor is controlled by the difference of the signal voltages at the collector ohmic resistors 9 and 10.

The fourth ohmic resistor 12 closes the DC circuit or path for the fourth transistor 4, via the reference or reference voltage transistor 8. The reference voltage transistor 8 is connected, due to the connection of its collector and base electrodes, as a diode, and functions to adjust a reference voltage which varies with variable currents and temperatures, in the same manner as the base-emitter forward voltage of a transistor.

The reference voltage assists the current-impressing or feedback transistor 3 to define, with the third ohmic resistor 11, a current source of impressed current. This results in a high in-phase suppression. The in-phase range of the operational amplifier becomes very high. The connection of the reference voltage transistor 8 to the feedback transistor 3 provides a simultaneous DC regulating loop having feedback coupling, which provides good stabilization for the working points.

The asymmetrical signal is derived from the collector electrode of the fifth transistor 5 of the asymmetry stage and is supplied to the end stage. The fifth and sixth ohmic resistors 13 and 14 function to adjust the collector currents of the sixth and seventh transistors 6 and 7. The Darlington end stage functions, with both its transistors 6 and 7, as a single phase transistor amplifier, in emitter connection. Contrary to the prior art, it requires no current source with impressed current, thereby providing the advantage of considerable simplification. THe modulation or control is great and is hardly subject to straying relative to a number of examples. The maximum controllability in positive direction is derived from the voltage to which the load resistance is applied, such load resistance being externally connected to the output. The controllability may thus be adjusted from outside the circuit, by a voltage divider, if necessary. The controllability in negative direction is almost independent of the load.

The output resistance of the operational amplifier of the invention is of adequately low resistance value. The load resistance provides many possible uses for the operational amplifier of the invention. When the load resistance has a very high resistance value, the appreciable flow of current through the load circuit of the end stage only, in addition to the current flow through the fourth transistor 4 and the reference transistor 8, as well as the fourth ohmic resistor 12, permits adjustment to a very low total current input which is notably less than that of known operational amplifiers. On the other hand, permissible load currents are so high that small servomotors and relays may be directly controlled by considerably lower resistance valued resistors.

The input and the output of the end stage are in phase opposition. It is thus possible to provide a constant amplification drop of 6 db per octave over a wide frequency range, by utilizing a single capacitor externally connected between the collector and base electrodes of the sixth transistor 6 of the end stage. This increases the phase reliability of the operational amplifier sufficiently to guarantee stability for all possible feedbacks.

The dependence of the amplification characteristics on the operational voltage is low, since the working points have considerable stability with respect to voltage variations or fluctuations. The temperature dependence of the parameters is eliminated to a considerable extent, due to the working point stability and the equality of the temperature coefficients of integrated resistors and transistors.

While the invention has been described by means of a specific example and in a specific embodiment, we do not wish to be limited thereto, for obvious modifications will occur to those skilled in the art without departing from the spirit and scope of the invention.

We claim:

1. An integrated operational amplifier comprising
a source of supply voltage;
a source of reference voltage;
first and second ohmic resistors;
a difference amplifier comprising first and second transistors each having a base electrode, a collector electrode connected to the source of supply voltage via a corresponding one of the first and second ohmic resistors, and an emitter electrode connected in common with that of the other;
input means connected to the base electrodes of the first and second transistors of the difference amplifier for supplying inverted and non-inverted signals;
a common emitter resistance connected between the emitter electrodes of the first and second transistors of the difference amplifier, and the source of reference voltage, said common emitter resistance comprising a third ohmic resistor connected in series with the collector-emitter path of a feedback transistor, said feedback transistor having a base electrode;
an asymmetry stage comprising fourth and fifth transistors of different conductivity types, said fifth transistor having an emitter electrode directly connected to the collector electrode of the second transistor of said difference amplifier, a base electrode directly connected to the emitter electrode of the fourth transistor of said asymmetry stage, and a collector electrode, and said fourth transistor having an emitter electrode directly connected to the base electrode of the fifth transistor of the asymmetry stage, a base electrode directly connected to the collector electrode of the first transistor of the difference amplifier and a collector electrode directly connected to said source of supply voltage;
a fourth ohmic resistor connected at one end to the emitter electrode of the fourth transistor and the base electrode of the fifth transistor of the asymmetry stage and at the other end to the base electrode of the feedback transistor;
an end stage comprising sixth and seventh transistors, said sixth transistor having a base electrode directly connected to the collector electrode of the fifth transistor of the asymmetry stage, an emitter electrode directly connected to the base electrode of the seventh transistor of the end stage and a collector electrode, said seventh transistor having a base electrode connected to the emitter electrode of the sixth transistor, a collector electrode directly connected to the collector electrode of the sixth transistor and an emitter electrode directly connected to said source of reference voltage;

a fifth ohmic resistor connected at one end to the collector electrode of the fifth transistor of the asymmetry stage and the base electrode of the sixth transistor of the end stage and connected at the other end to the emitter electrode of the sixth transistor and the base electrode of the seventh transistor of the end stage;

a sixth ohmic resistor connected between the base electrode of the seventh transistor of the end stage and the source of reference voltage;

output means connected to the collector electrodes of the sixth and seventh transistors of the end stage for providing the output of the operational amplifier; and a reference transistor having a base electrode directly connected to the base electrode of the feedback transistor, a collector electrode directly connected to the base electrode thereof and an emitter electrode directly connected to said source of reference voltage.

2. An integrated operational amplifier as claimed in claim 1, wherein each transistor is of the same conductivity type and the fifth transistor of the asymmetry stage is of the opposite conductivity type.

3. An integrated operational amplifier as claimed in claim 1, wherein each transistor is of npn conductivity type and the fifth transistor of the asymmetry stage is of pnp conductivity type.

4. An integrated operational amplifier as claimed in claim 1, wherein the feedback transistor has a collector electrode directly connected to the emitter electrode of each of said first and second transistors of the difference amplifier and an emitter electrode connected to the third ohmic resistor, said third ohmic resistor being directly connected to the source of reference potential.

* * * * *